(12) United States Patent
Karale et al.

(10) Patent No.: US 10,774,638 B2
(45) Date of Patent: Sep. 15, 2020

(54) METHODS AND SYSTEMS FOR CHARACTERIZING AND/OR MONITORING WORMHOLE REGIMES IN MATRIX ACIDIZING

(71) Applicant: Halliburton Energy Services, Inc., Houston, TX (US)

(72) Inventors: Chaitanya Mallikarjun Karale, Pune (IN); Mohammed Monsur Alam, Doha (QA)

(73) Assignee: Halliburton Energy Services, Inc., Houston, TX (US)

( * ) Notice: Subject to any disclaimer, the term of this patent is extended or adjusted under 35 U.S.C. 154(b) by 193 days.

(21) Appl. No.: 15/568,173

(22) PCT Filed: May 29, 2015

(86) PCT No.: PCT/US2015/033166
§ 371 (c)(1),
(2) Date: Oct. 20, 2017

(87) PCT Pub. No.: WO2016/195623
PCT Pub. Date: Dec. 8, 2016

(65) Prior Publication Data
US 2018/0080316 A1  Mar. 22, 2018

(51) Int. Cl.
*E21B 49/00* (2006.01)
*C09K 8/72* (2006.01)
(Continued)

(52) U.S. Cl.
CPC .............. *E21B 49/008* (2013.01); *C09K 8/72* (2013.01); *E21B 41/0092* (2013.01);
(Continued)

(58) Field of Classification Search
CPC .............................. E21B 49/008; E21B 43/26
See application file for complete search history.

(56) References Cited

U.S. PATENT DOCUMENTS

| 4,881,599 A * | 11/1989 | Franco | E21B 33/124 166/284 |
| 6,196,318 B1 * | 3/2001 | Gong | E21B 43/25 166/307 |

(Continued)

FOREIGN PATENT DOCUMENTS

WO    2015-013697 A1    1/2015

OTHER PUBLICATIONS

Fredd et al., "The Existence of an Optimum Damkohler Number for Matrix Stimulation of Carbonate Formations," in SPE 38167, presented at the SPE European Formation Damage Conference, The Hague, The Netherlands, Jun. 2-3, 1997 (Year: 1997).*

(Continued)

*Primary Examiner* — John Fitzgerald
(74) *Attorney, Agent, or Firm* — Thomas Rooney; Baker Baker L.L.P.

(57) ABSTRACT

Methods and systems for designing, monitoring, and/or performing acidizing treatments in subterranean formations are provided. In certain embodiments, the methods comprise: determining a wellbore pressure and a fluid flow distribution for an acidizing fluid introduced into a portion of a subterranean formation; determining a breakthrough pore volume at a plurality of depths in the formation to provide a PVBT curve; determining whether a slope of the PVBT curve at a point corresponding to a first flow rate of the acidizing fluid in the subterranean formation is indicative of a compact dissolution regime, e.g., is less than zero or a minimum point of a range of tolerance thereof; and, if so, identifying a second flow rate for introducing the acidizing fluid into the interval of the well bore that is greater than the first flow rate.

6 Claims, 8 Drawing Sheets

(51) Int. Cl.
*E21B 43/26* (2006.01)
*G06F 30/00* (2020.01)
*E21B 47/003* (2012.01)
*E21B 41/00* (2006.01)
*E21B 49/08* (2006.01)

(52) U.S. Cl.
CPC ............ *E21B 43/26* (2013.01); *E21B 47/003* (2020.05); *G06F 30/00* (2020.01); *E21B 49/0875* (2020.05)

(56) References Cited

U.S. PATENT DOCUMENTS

| | | | |
|---|---|---|---|
| 6,668,922 B2 | 12/2003 | Ziauddin et al. | |
| 7,561,998 B2* | 7/2009 | Panga | E21B 43/16 |
| | | | 166/281 |
| 7,603,261 B2 | 10/2009 | Tardy | |
| 7,657,415 B2 | 2/2010 | Panga et al. | |
| 7,774,183 B2* | 8/2010 | Tardy | E21B 43/25 |
| | | | 166/252.5 |
| 7,853,440 B2 | 12/2010 | Cohen et al. | |
| 8,016,034 B2 | 9/2011 | Glasbergen et al. | |
| 9,617,839 B2* | 4/2017 | Modavi | E21B 43/16 |
| 9,771,785 B2* | 9/2017 | Nguyen | E21B 43/267 |
| 9,909,057 B2* | 3/2018 | Nguyen | E21B 43/26 |
| 9,938,800 B2* | 4/2018 | Karale | C09K 8/60 |
| 2003/0225521 A1 | 12/2003 | Panga | E21B 43/16 |
| | | | 702/6 |
| 2006/0000609 A1* | 1/2006 | Cavazzoli | C09K 8/74 |
| | | | 166/280.1 |
| 2006/0184346 A1* | 8/2006 | Panga | E21B 43/16 |
| | | | 703/9 |
| 2007/0135314 A1* | 6/2007 | Frenier | C09K 8/52 |
| | | | 507/260 |
| 2008/0015831 A1* | 1/2008 | Tardy | E21B 43/25 |
| | | | 703/10 |
| 2008/0207470 A1* | 8/2008 | Welton | C09K 8/74 |
| | | | 507/209 |
| 2009/0294122 A1* | 12/2009 | Hansen | E21B 43/00 |
| | | | 166/250.01 |
| 2010/0056405 A1* | 3/2010 | Ali | C09K 8/528 |
| | | | 507/240 |
| 2010/0161292 A1* | 6/2010 | Shook | E21B 43/00 |
| | | | 703/2 |
| 2010/0224365 A1 | 9/2010 | Abad | |
| 2011/0005761 A1* | 1/2011 | Luo | C09K 8/035 |
| | | | 166/308.2 |
| 2012/0016649 A1* | 1/2012 | Thambynayagam | E21B 43/12 |
| | | | 703/10 |
| 2012/0285695 A1* | 11/2012 | Lafferty | C09K 8/03 |
| | | | 166/310 |
| 2013/0032338 A1 | 2/2013 | Kalia et al. | |
| 2013/0166262 A1* | 6/2013 | Shook | E21B 43/00 |
| | | | 703/2 |
| 2014/0054040 A1* | 2/2014 | Zhao | E21B 43/16 |
| | | | 166/307 |
| 2014/0166291 A1* | 6/2014 | Friesen | C09K 8/584 |
| | | | 166/307 |
| 2014/0352959 A1* | 12/2014 | Nelson | C09K 8/70 |
| | | | 166/276 |
| 2015/0007989 A1* | 1/2015 | Tan | C09K 8/602 |
| | | | 166/279 |
| 2015/0021021 A1* | 1/2015 | Merron | E21B 43/26 |
| | | | 166/255.1 |
| 2015/0260021 A1* | 9/2015 | Reyes | C09K 8/528 |
| | | | 166/300 |
| 2016/0024914 A1* | 1/2016 | Ghommem | E21B 43/25 |
| | | | 166/254.2 |
| 2016/0061017 A1* | 3/2016 | Nguyen | E21B 43/267 |
| | | | 166/280.2 |
| 2016/0076369 A1* | 3/2016 | Ziauddin | C09K 8/60 |
| | | | 166/250.12 |
| 2016/0108307 A1* | 4/2016 | Nguyen | E21B 43/26 |
| | | | 166/300 |
| 2016/0194944 A1* | 7/2016 | Walters | E21B 43/26 |
| | | | 166/280.1 |
| 2016/0245049 A1* | 8/2016 | Mogensen | E21B 43/25 |
| 2017/0107796 A1* | 4/2017 | Karale | C09K 8/60 |
| 2018/0022982 A1* | 1/2018 | Sierra | C09K 8/508 |
| | | | 166/292 |
| 2018/0305603 A1* | 10/2018 | Shumway | C09K 8/84 |

OTHER PUBLICATIONS

Gdanski, "A Fundamentally New Model of Acid Wormholing in Carbonates," in SPE 54729, presented at the 1999 European Formation Damage Conference, The Hague, The Netherlands, May 31-Jun. 1, 1999 (Year: 1999).*
Holmes, J., "Modeling Advanced Wells in Reservoir Simulation," Distinguished author series, Nov. 2001, XP-002419306 (Year: 2001).*
Cohen, Charles Edouard, et al. "From pore scale to wellbore scale: Impact of geometry on wormhole growth in carbonate acidization." Chemical Engineering Science 63.12 (2008): 3088-3099.
International Search Report and Written Opinion issued in related PCT Application No. PCT/US2015/033166 dated Feb. 22, 2016, 12 pages.
Jones, A. T., and D. R. Davies. "Quantifying acid placement: the key to understanding damage removal in horizontal wells." SPE Formation Damage Control Symposium. Society of Petroleum Engineers, 1996.
PetroWiki, "Acid Placement and Coverage", found at http://petrowiki.org/Acid_placement_and_coverage, 4 pages, 2017.
Glasbergen, Gerard, and Marten Buijse. "Improved Acid Diversion Design Using a Placement Simulator." SPE Russian Oil and Gas Technical Conference and Exhibition. Society of Petroleum Engineers, 2006.
Glasbergen, Gerard, Nitika Kalia, and Malcolm Seth Talbot. "The Optimum Injection Rate for Wormhole Propagation: Myth or Reality?." 8th European Formation Damage Conference. Society of Petroleum Engineers, 2009.
Buijse, Marten Adriaan, and Gerard Glasbergen. "A semi-empirical model to calculate wormhole growth in carbonate acidizing." SPE Annual Technical Conference and Exhibition. Society of Petroleum Engineers, 2005.
Talbot, Malcolm Seth, and Rick David Gdanski. "Beyond the Damkohler number: a new interpretation of carbonate wormholing." Europec/EAGE Conference and Exhibition. Society of Petroleum Engineers, 2008.
Tardy, Philippe Michel Jacques, Bruno Lecerf, and Yenny Christanti. "An experimentally validated wormhole model for self-diverting and conventional acids in carbonate rocks under radial flow conditions." European Formation Damage Conference. Society of Petroleum Engineers, 2007.

* cited by examiner

METHODS AND SYSTEMS FOR CHARACTERIZING AND/OR MONITORING WORMHOLE REGIMES IN MATRIX ACIDIZING

CROSS-REFERENCE TO RELATED APPLICATION

The present application is a U.S. National Stage Application of International Application No. PCT/US2015/033166 filed May 29, 2015, which is incorporated herein by reference in its entirety for all purposes.

BACKGROUND

The present disclosure relates to methods and systems for use in treating subterranean formations, and more specifically, methods and systems for designing, monitoring, and/or performing acidizing treatments in subterranean formations.

Hydrocarbons, such as oil and gas, are commonly obtained from subterranean formations that may be located onshore or offshore. The development of subterranean operations and the processes involved in removing hydrocarbons from a subterranean formation typically involve a number of different steps such as, for example, drilling a wellbore at a desired well site, treating the wellbore to optimize production of hydrocarbons, and performing the necessary steps to produce and process the hydrocarbons from the subterranean formation.

Acid treatments are sometimes used, among other reasons, to stimulate and increase the production of hydrocarbons in a subterranean formation. This is commonly referred to as acidizing. One such aqueous acid treatment, referred to as "matrix acidizing," involves the introduction of an acid into a subterranean formation under pressure so that the acid flows through the pore spaces of the formation. The acid of the aqueous acid treatment reacts with acid soluble materials contained in the formation to increase the size of the pore spaces and increase the permeability of the formation.

In certain types of formations such as carbonate formations, matrix acidizing creates conductive flow channels known as wormholes that bypass the damage in the formation (e.g., in the near well bore area). The wormholes are formed when the matrix of the porous and permeable rock is dissolved by reactive fluids. In many instances, it is desirable to form a single primary wormhole that penetrates deeply into the formation (which is sometimes referred to as a "dominant wormhole" regime) to bypass damage in the near well bore area, and to do so with the minimum volume of acid needed. The fluid injection rate is one important consideration in acidizing operations, as it can impact how the acid will react with the formation and whether it will develop deep penetrating wormholes into the formation. When the injection rate is too low, the acidizing fluid may only dissolve the rock in the vicinity of the wellbore and wormholes may not form. This regime of acidizing is sometimes referred to as a "compact dissolution" or "face dissolution" regime. When the injection rate is too high, the treatment may form thick and shallow wormholes that do not penetrate deeply into the formation. This regime of acidizing is sometimes referred to as a "ramified wormhole" or "uniform dissolution" regime.

Traditionally, treatment fluids associated with acid treatments such as matrix-acidizing are injected at the maximum pressure differential and injection rate ("MAPDIR"). While this injection rate is simple, it typically uses large volumes of acid, is limited by pump and tubing capacity, and may not produce the desired, regime of wormholes in the subterranean formation.

BRIEF DESCRIPTION OF THE DRAWINGS

These drawings illustrate certain aspects of some of the embodiments of the present disclosure and should not be used to limit or define the claims.

While embodiments of this disclosure have been depicted, such embodiments do not imply a limitation on the disclosure, and no such limitation should be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DESCRIPTION OF CERTAIN EMBODIMENTS

Illustrative embodiments of the present disclosure are described in detail herein. In the interest of clarity, not all features of an actual implementation may be described in this specification. It will of course be appreciated that in the development of any such actual embodiment, numerous implementation-specific decisions may be made to achieve the specific implementation goals, which may vary from one implementation to another. Moreover, it will be appreciated that such a development effort might be complex and time-consuming, but would nevertheless be a routine undertaking for those of ordinary skill in the art having the benefit of the present disclosure.

The present disclosure relates to methods and systems for use in treating subterranean formations, and more specifically, methods and systems for designing, monitoring, and/or performing acidizing treatments in subterranean formations.

In particular, the present disclosure provides methods and systems for characterizing and/or monitoring wormholing regimes in matrix acidizing treatments in subterranean formations, as well as methods of performing matrix acidizing treatments using data indicative of wormhole regimes, e.g., wormhole velocity profiles. In some embodiments, the methods of the present disclosure comprise the following steps: determining a wellbore pressure and a fluid flow distribution for an acidizing fluid introduced into an interval of a well bore penetrating a portion of a subterranean formation; and determining a breakthrough pore volume for each of a plurality of depths in the portion of the formation to provide a PVBT curve comprising the breakthrough pore volume expressed as a function of an interstitial velocity of the acidizing fluid at the tip of a wormhole at each of the plurality of depths. Then, it is determined whether a slope of the PVBT curve at a point corresponding to a flow rate of the acidizing fluid in the subterranean formation is indicative of a compact dissolution regime, e.g., is less than zero or, alternatively, less than a minimum point of a range of tolerance thereof. If the slope of the PVBT curve at the point corresponding to the flow rate is indicative of a compact dissolution regime, e.g., is less than zero or the minimum point of the range of tolerance thereof, the flow rate for introducing the acidizing fluid into the interval of the well bore may be increased. If the slope of the PVBT curve at the point corresponding to the first flow rate is indicative of a uniform dissolution regime, e.g., is greater than zero or a maximum point of the range of tolerance thereof, the flow rate for introducing the acidizing fluid into the interval of the well bore may be decreased.

In certain embodiments, the methods and systems of the present disclosure may characterize and/or monitor wormholing regimes in matrix acidizing treatments in subterranean formations and/or perform matrix acidizing treatments using other data relating to wormhole regimes. In these embodiments, the methods of the present disclosure comprise the following steps: determining a wellbore pressure and a fluid flow distribution for an acidizing fluid introduced into in an interval of a well bore penetrating a portion of a subterranean formation; determining an optimum interstitial velocity for the acidizing fluid in the subterranean formation and an interstitial velocity of the acidizing fluid at a tip of a wormhole in the subterranean formation at a first flow rate; and comparing the optimum interstitial velocity to the interstitial velocity of the acidizing fluid at the tip of the wormhole at each of a plurality of depths in the formation. If the interstitial velocity of the acidizing fluid at the tip of the wormhole is less than the optimum interstitial velocity or a minimum point of a range of tolerance thereof, the flow rate for introducing the acidizing fluid into the interval of the well bore may be increased. If the interstitial velocity of the acidizing fluid at the tip of the wormhole is greater than the optimum interstitial velocity or a maximum point of the range of tolerance thereof, the flow rate for introducing the acidizing fluid into the interval of the well bore may be decreased.

In some embodiments, the methods of the present disclosure comprise introducing an acidizing fluid into at least a portion of a subterranean formation (e.g., through a well bore penetrating at least a portion of the subterranean formation) at one or more of the identified flow rates in order to create or enlarge one or more voids or wormholes in the formation, which may stimulate and/or facilitate the flow of hydrocarbons or other produced fluids there through. The present disclosure also provides systems and computer programs for accomplishing the methods described herein.

In certain embodiments, the flow rate at which an acidizing fluid is introduced into a particular portion of a subterranean formation (e.g., an interval of a well bore) may be increased or decreased by increasing or decreasing the rate at which the acidizing fluid is injected (e.g., pumped) into a well bore or tool extending into or penetrating the subterranean formation. In certain embodiments, depending on the circumstances or objective of a particular treatment, the flow rate at which an acidizing fluid is introduced into a particular portion or region of a subterranean formation may be increased or decreased by using a diverting agent or tool to divert the acidizing fluid toward or away from a particular region of the formation, thus increasing or decreasing the flow rate into the formation without necessarily increasing or decreasing the injection rate. Thus, it will be understood that references in this disclosure to increasing or decreasing the flow rate at which an acidizing fluid is introduced in a subterranean formation may be accomplished using any means, including the use of a diverting agent, and do not necessarily require increasing or decreasing the fluid injection rate.

Among the many potential advantages to the methods and systems of the present disclosure, only some of which are alluded to herein, the methods and systems of the present disclosure may facilitate identification of downhole wormholing regimes during an acidizing operation based on the injection rates and/or appropriate operational decision making based thereon. In certain embodiments, the calculated injection rates or injection rate profiles using the methods and systems of the present disclosure may significantly increase stimulation over traditional injection methods. In some embodiments, the present disclosure may provide methods for determining and/or controlling injection rates faster and/or more efficiently than existing methods, saving time and computational power. In some embodiments, the methods and systems of the present disclosure may allow for more of the acidizing treatment to be automated, reducing the amount of hands-on time needed by engineers or other personnel at a well site. In some embodiments, the methods of the present disclosure may be used during injection to provide updated real-time adjustments to an injection rate or rate profile. Ultimately, performing acidizing treatments using certain embodiments of the present disclosure may provide more effective acidizing and/or stimulation (e.g., less compact and/or uniform dissolution, more dominant wormholing) and/or less damage in those treatments, as well as enhanced confidence in acidizing treatment results.

The wormhole regime produced in an acidizing treatment in a carbonate formation will often depend at least in part on the acid injection rate, as noted above, as well as the interstitial velocity of the acid flowing in the formation. While pumping acid into a well bore penetrating a subterranean formation, the interstitial velocity of the fluid decreases as the fluid moves away from the well bore due to an increase in the penetration radius and flow area. As the acid's interstitial velocity decreases, the acid's flux decreases as well. The "pore volume to break through" (PVBT) in a core sample of the formation rock (which is defined as the ratio of the volume of fluid injected to achieve channel breakthrough to the original volume of the pore space in the core) at each depth i in a treatment interval can be calculated as a function of acid flux and/or interstitial velocity to create a wormhole velocity profile, which can be used to identify the wormholing regime corresponding to a given leakoff rate and pumping rate during an acidizing treatment.

Figure 1:
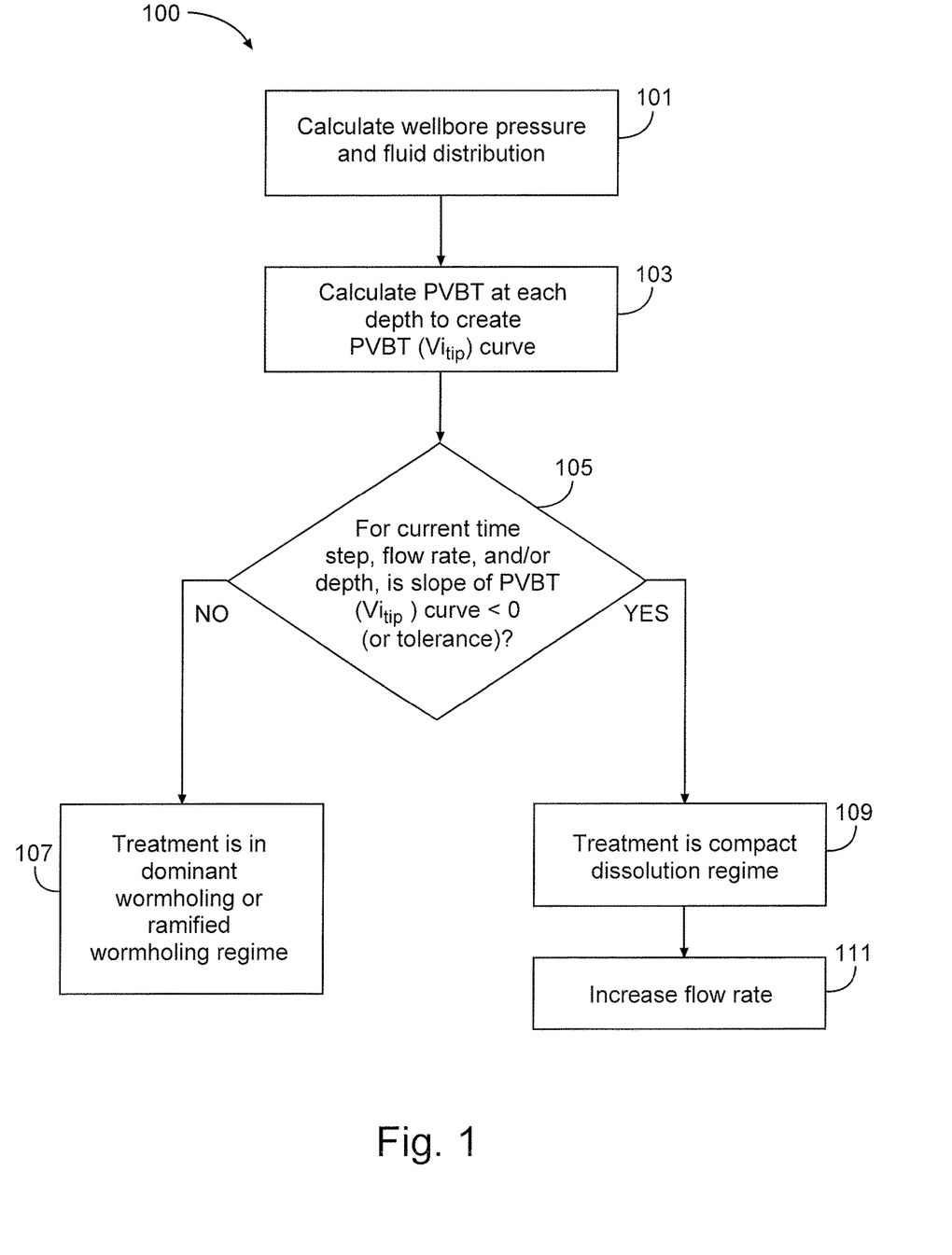
FIG. 1 is a process flow diagram illustrating a method for determining an injection rate for an acidizing treatment fluid according to certain embodiments of the present disclosure.

Referring now to FIG. 1, a process flow 100 for identifying wormholing regimes during an acidizing treatment according to certain embodiments of the present disclosure is shown. The use of arrows in FIG. 1 is not meant to imply any particular order in which the methods of the present disclosure must be performed. First, at block 101, the wellbore pressure and fluid distribution in the treatment interval in the formation are calculated for a current time step 1. In certain embodiments, a numerical model may be used to calculate fluid distribution and wellbore pressure.

For example, in certain embodiments, a pseudo-steady-state model may be used to calculate the wellbore pressure and fluid distribution in the reservoir. For such a model, at each injection rate, the pressure, and the flow rates both along the wellbore and into the formation are calculated at discrete points along the wellbore, subject to specified pressure and flow boundary conditions. Wellbore pressure depends on the flow rate along the wellbore, the hydrostatic head of the acidizing fluid, the wellbore configuration and completion details, and the leakoff rate into the formation. In some embodiments, the pressure drop along the wellbore at a point z due to a flow rate along the wellbore q is given by Equation (1):

$$\frac{\partial p_w}{\partial z} = F(q) + \rho g \cos\theta \qquad (1)$$

where $p_w$ is wellbore pressure, F is the sum of the frictional and inertial pressure drops, and $\rho g \cos\theta$ is hydrostatic head of a fluid of density $\rho$. Frictional pressure drop depends on wellbore geometry, fluid rheology, and the flow regime, and can be written in terms of experimentally or theoretically derived expressions.

Calculating flow distribution requires calculating the pressure drop in the formation between the reservoir and the wellbore. The pressure gradient in the formation depends on the flow rate into the formation, the formation properties, the fluid properties, and the radial position from the wellbore. In certain embodiments, to calculate the pressure drop between the reservoir and the wellbore, the formation is divided radially into different regions, each having constant formation and fluid properties. In certain embodiments, the formation has regions of varying permeability. In some embodiments, such regions can be determined from the calculated position of the fluid fronts and the initial permeability profile.

For a given injection rate (flow rate), pressure drop may be determined for each region using the region's characteristic permeability together with Darcy's law for a Newtonian fluid, a modified form of Darcy's law for power-law fluids, or a line-source pressure distribution for the compressible reservoir fluids. The difference between the wellbore pressure and the average reservoir pressure is given by the sum of all the individual pressure drops for these regions, which for a flow rate q along the wellbore is given by Equation (2):

$$p_w(z) - p_\infty(z) = -\alpha(z)\frac{\partial q}{\partial z} + \beta(z)\left(\frac{\partial q}{\partial z}\right)^n + \chi(z) \qquad (2)$$

where $(-\partial q/\partial z)$ is the corresponding flow rate into the formation at the point z per unit height of the zone (depth grid i), the terms $\alpha(z)$ and $\beta(z)$ are due to the instantaneous resistance to flow of the displaced fluid and the injected fluid, respectively, and the term $\chi(z)$ includes all terms due to the compression history of the displaced fluid. Flow distribution is determined at each injection rate by solving Equations (1) and (2) for $p_w(z)$ and $q(z)$ subject to pressure and flow-rate boundary conditions.

PVBT for a core sample can be calculated empirically by dividing the volume of acid needed to propagate the wormholes from the inlet to the outlet by the original pore volume of the core. For given conditions (e.g., temperature, flow rate, acidizing fluid, formation type), a lower PVBT indicates more efficient stimulation. By running core flood experiments at different flow rates, measuring the breakthrough volume, and calculating PVBT, an empirically-based breakthrough curve of PVBT versus flow rate or interstitial velocity can be determined. In certain embodiments, a breakthrough curve may be fitted to PVBT versus flow rate/interstitial velocity data from core flood experiments. For example, Equation (3) may be fitted to the data:

$$PVBT = \frac{(Vi*MF)^a}{W_{eff} * MF * \left(1 - e^{-W_B(Vi*MF)^b}\right)^c} \qquad (3)$$

where Vi is the interstitial velocity of the fluid in a core sample used in liner core flood test or interstitial velocity in radial flow, $W_B$ is the wormhole beta factor, $W_{eff}$ is the wormhole efficiency factor, and a is a fitting variable. $W_{eff}$, $W_B$, and MF can be determined empirically from a core flood experiment. In certain embodiments, the other exponents of Equation (3), i.e., b and c, may also be changed to fit the breakthrough curve to experimental data. In some embodiments, the interstitial velocity of the fluid at the tip of the wormhole can be related to wormhole velocity at the tip of the wormhole $V_{wh}$ by Equation (4):

$$PVBT = \frac{Vi}{V_{wh}} \qquad (4)$$

Referring back to FIG. 1, at block 103, the breakthrough pore volume for the current time step $PVBT_{radial}$ can be calculated at each depth i in a treatment interval from Equation (3). Since $PVBT_{radial}$ also can be expressed as the interstitial velocity of the fluid at the tip of the wormhole $Vi_{tip}$ divided by the new wormhole velocity at the tip of the wormhole $V_{wh}$, these equations can be used to create a wormhole velocity profile described as a wormhole propagation model. In certain embodiments, the wormhole velocity profile for a portion of a subterranean formation can be created using a known wormhole propagation model. For example, in one method of creating the profile, the total pump time is divided into small steps $\Delta t$, and the wormhole penetration depth $R_{wh}$ is calculated at each time step t, with $R_{wh}$ at t=0 being equal to the radius of the wellbore. $R_{wh}$ is then calculated for each t by repeating each of the following calculations for each time step. First, the interstitial velocity of the fluid at the tip of the wormhole $Vi_{tip}$ is calculated from $R_{wh}(t)$ using Equation (5) below:

$$Vi_{tip} = Vi_{radial\ tip} = \frac{Q}{2\pi R_{wh}h\phi} \qquad (5)$$

wherein Q is the injection rate of the acid, h is the height of the treatment zone and φ is the porosity of the formation. Then, the wormhole velocity at the tip of the wormhole $V_{wh}$ is calculated using Equation (6) below, which is obtained by rearranging Equations (3) and (4).

$$V_{wh}(R_{wh}) = W_{eff}[MF\ Vi(R_{wh})]^c B(Vi) \tag{6}$$

wherein $W_{eff}$ is equal to the wormhole efficiency factor according to Equation (7) below $$W_{eff} = B_1 C^{B_2} B_3 \left(\frac{L}{A}\right)^{B_4} \tag{7}$$

B(Vi) is the wormhole B function according to Equation (8) below $$B(Vi) = 1 - \exp[-W_B(Vi_{tip} MF)^a]^b \tag{8}$$

$W_B$ is a wormhole B factor according to Equation (9) below $$W_B = \sqrt{\frac{\left(B_1 0.07^{B_2} D_1 e^{\frac{D_2}{T}}\right)^2}{B_1 C^{B_2}}} D_3 \left(\frac{L}{A}\right)^{D_4} \tag{9}$$

MF is a morphology factor equal to $$A_1 \phi^{A_2} P^{A_3} \phi^{A_4},$$

P is the permeability of the formation, T is the temperature in the formation, C is the concentration of the acid, L is the core length, A is the core area, and a, b, c, $A_1$, $A_2$, $A_3$, $A_4$, $B_1$, $B_2$, $B_3$, $B_4$, $D_1$, $D_2$, $D_3$, and $D_4$ are each fitting coefficients. Finally, $V_{wh}$ is used to calculate a new value for $R_{wh}$ at each time step (t+Δt) using Equation (10) below.

$$R_{wh}(t+\Delta t) = R_{wh}(t) + V_{wh} \times \Delta t \tag{10}$$

In certain embodiments, a scaling factor also may be applied to the wormhole propagation model, among other reasons, to better capture the downhole physics of radial flow and fluid leak offs. When used, the scaling factor may simply be applied in the appropriate locations in one or more of the equations above, which would be recognized by a person of skill in the art with the benefit of this disclosure.

Figure 2:
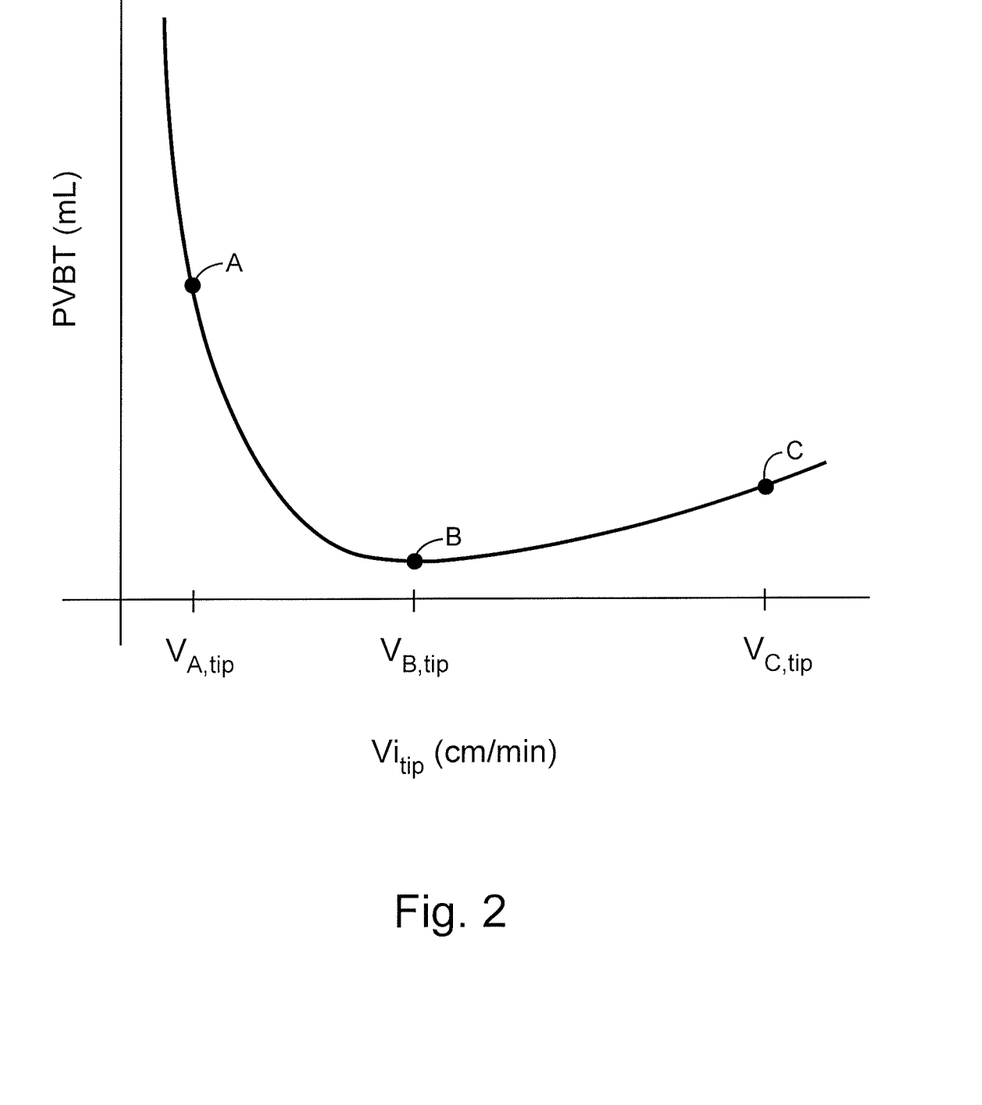
FIG. 2 is a graph showing a pore volume to breakthrough (also referred as ratio of interstitial velocity at tip to wormhole velocity) curve according to certain embodiments of the present disclosure.

An example of an idealized pore volume to breakthrough (also referred as ratio of interstitial velocity at tip to wormhole velocity) curve for an acid being used to treat a subterranean formation according to certain embodiments of the present disclosure is shown in FIG. 2, which is a plot of the breakthrough pore volume (PVBT) in a formation versus the interstitial velocity of an acidizing fluid at the tip of a wormhole ($Vi_{tip}$) in the formation. The slope S of the PVBT curve plotted in FIG. 2 at any time step t may be calculated according to Equation (11) below:

$$S = \frac{\left(\frac{Vi_{tip}}{V_{wh}}\right)_t - \left(\frac{Vi_{tip}}{V_{wh}}\right)_{(t-1)}}{(Vi_{tip})_t - (Vi_{tip})_{(t-1)}} \tag{11}$$

In the embodiment shown, where the slope S of the PVBT curve is zero or in the vicinity of zero (e.g., at point B, where the $Vi_{tip}$ corresponds to $V_{B,tip}$), a dominant wormholing regime may be indicated. The point at which the slope S=0 also corresponds to the lowest volume of acid needed to create a dominant wormhole in the formation. In reality, in certain embodiments, a dominant wormholing regime may be indicated by a slope S within a certain range of tolerance from zero (e.g., ±0.2). In some embodiments, the tolerance range alternatively can be the range of slope values corresponding to the points on PVBT curve or $Vi_{tip}$ $V_{wh}$ profile ranging from $PVBT_{optimum}$ (i.e., the PVBT value on the curve corresponding to $Vi_{optimum}$, the calculation of which is discussed below) by a given percentage (e.g., ±0-25%). If the slope S of the PVBT curve is greater than zero (or above the applicable tolerance range) (e.g., at point C, where the $Vi_{tip}$ corresponds to $V_{C,tip}$), a uniform dissolution or ramified wormholing regime may be indicated. If the slope S of the PVBT curve is less than zero by more than the applicable tolerance range (e.g., at point A, where the $Vi_{tip}$ corresponds to $V_{A,tip}$), a compact dissolution regime may be indicated. As a person of skill in the art with the benefit of this disclosure will note, the value of the denominator in Equation (11) may be equal to zero where the interstitial velocity is same for both the time steps t and (t-1), in which case the numerator is also zero and slope S may be undefined. This may occur, for example, as the injection rate of the acidizing fluid is being increased for an appropriate amount of fluid advancement. For these instances where the slope S is undefined, a method or system of the present disclosure may be configured to indicate or assign the same wormholing regime to that time step as the regime indicated at the previous time step.

Referring back to FIG. 1, in the process 100, once the wormhole velocity profile is determined, the slope of the PVBT curve at any particular time t, depth grid i, and flow rate may be estimated in block 105 using Equation (11) above. For example, in a real-time application of the methods of the present disclosure, the injection rate being used in a particular operation may be used to calculate the flow distribution, well bore pressure, wormhole velocity, and slope of the PVBT curve using the equations above. If the slope of the PVBT curve is not less than (i.e., is greater than or equal to) zero or a minimum endpoint of a tolerance range thereof, a dominant wormholing regime or ramified wormholing regime may be indicated at block 107. In certain embodiments, neither of these regimes may require an adjustment in the acidizing treatment, and the treatment may be allowed to proceed under the existing parameters. In other embodiments, the process may include further steps to determine whether the slope of the PVBT curve is greater than zero by some tolerance or threshold amount, which may indicate if the treatment is proceeding according to a ramified wormholing regime or uniform dissolution regime. In certain embodiments, if such a regime is indicated, the flow or injection rate of the acidizing fluid may be decreased in order to move along the PVBT curve to a point where its slope is equal to or within a tolerance range of zero to produce a dominant wormholing regime. In certain embodiments, a diverting agent may be used to divert an acidizing fluid away from a particular region of the formation, thus decreasing the flow rate in a particular region of the formation without necessarily decreasing the injection rate.

Referring again to FIG. 1, if the slope of the PVBT curve is less than zero or less than a minimum endpoint of a tolerance range thereof, a compact dissolution regime may be indicated at block 109. In the embodiment shown, this regime may prompt an operator to increase the flow rate of the acid or acidizing fluid at block 111 in order to move along the PVBT curve to a point where its slope is equal to or within a tolerance range of zero to produce a dominant wormholing regime. In certain embodiments, a diverting agent may be used to divert an acidizing fluid into a particular region of the formation, thus increasing the flow rate in a particular region of the formation without necessarily increasing the injection rate.

Figure 5A:
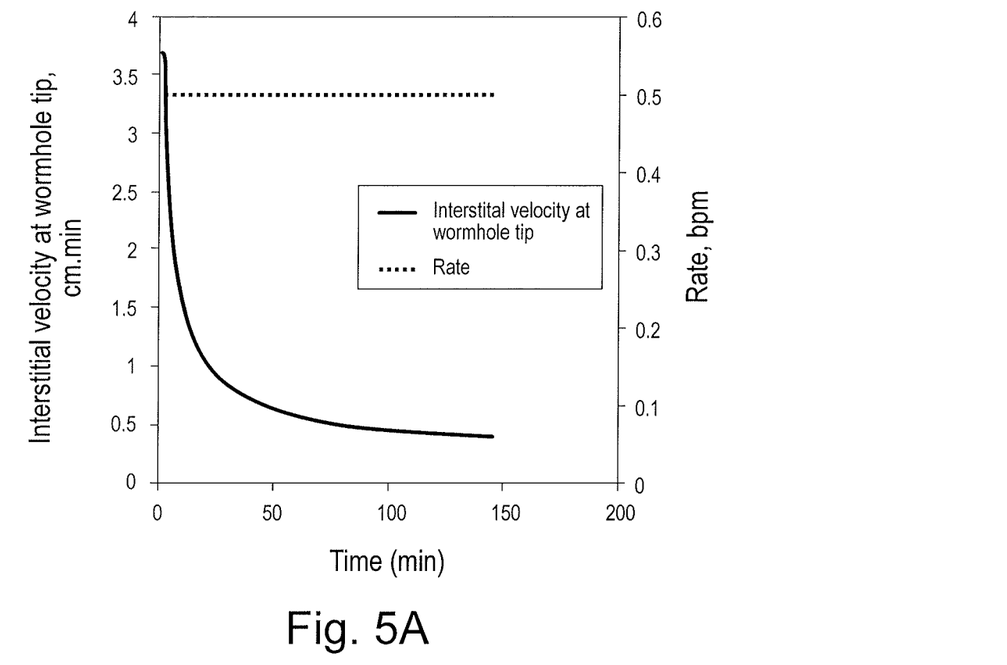
FIGS. 5A and 5B are graphs showing (A) the interstitial velocity of a fluid pumped into a formation over time at a constant rate, and (B) the corresponding pore volume to breakthrough (PVBT) curve in that formation according to certain embodiments of the present disclosure, respectively.
Figure 5B:
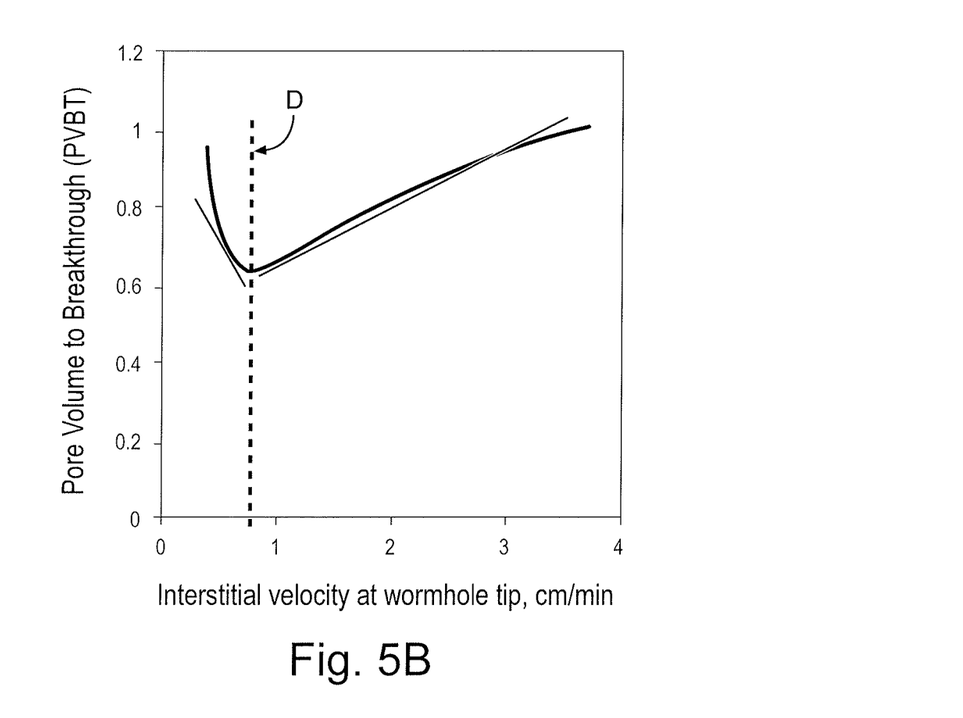

The process 100 may be applied and used in acidizing treatments in which an acidizing fluid is pumped into a formation at a constant rate, an increasing rate, a decreasing rate, or some combination thereof. For example, referring now to FIGS. 5A and 5B, FIG. 5A is a graph showing pumping rate and interstitial velocity over time in an acidizing treatment in a subterranean formation, and FIG. 5B is a graph of a corresponding PVBT curve created for the acidizing treatment in the formation, plotting PVBT as a function of the interstitial velocity of the acidizing fluid. As shown in FIG. 5A, since the acidizing fluid is pumped into the formation at a constant rate, the interstitial velocity of the fluid (and fluid flux) at the wormhole tip decreases with time as the fluid propagates in the formation away from the wellbore. Referring to FIG. 5B, in moving along the PVBT curve in the direction of decreasing interstitial fluid velocity at the wormhole tip (i.e., right to left), the slope of the PVBT curve begins as a positive value in the region to the right of line D, and decreases until the slope is equal to zero at the interstitial velocity value at line D. In the region significantly away to the right of line D, the acidizing treatment remains in the uniform dissolution and remains in dominant wormholing regime closer to line D. Once the interstitial velocity decreases further below the level at line D (i.e., to the left of line D), the slope of the PVBT curve changes to a negative value, and the acidizing treatment transitions toward a compact dissolution regime. In certain embodiments of the present disclosure, when the injection rate of the acidizing fluid yields an interstitial velocity at the tip that corresponds to a point along the PVBT curve in the region to the left of line D, this may indicate that the operator should increase the injection rate to increase the interstitial velocity at the wormhole tip, driving the treatment to the right side of the PVBT curve, in order to maintain a uniform dissolution or dominant wormholing regime.

In certain embodiments, the relative magnitude of the slope of the PVBT curve may suggest the relative amount that the injection rate should be increased or decreased. For example, if the slope of the PVBT curve at a particular point has a relatively high magnitude, this may suggest that the injection rate should be increased or decreased by a relatively larger amount to achieve a dominant wormholing regime, whereas slopes of relatively smaller magnitudes may suggest smaller increases or decreases to achieve that regime. In other embodiments, iterative calculations may be performed by calculating slope values for one or more injection rates different from the current rate (i.e., increased or decreased) to see if those slope values fall within the tolerance range or close to zero. The data from these iterative calculations may be used to identify a higher or lower flow rate that will achieve a dominant wormholing regime and the necessary flow rate can be chosen.

Figure 6A:
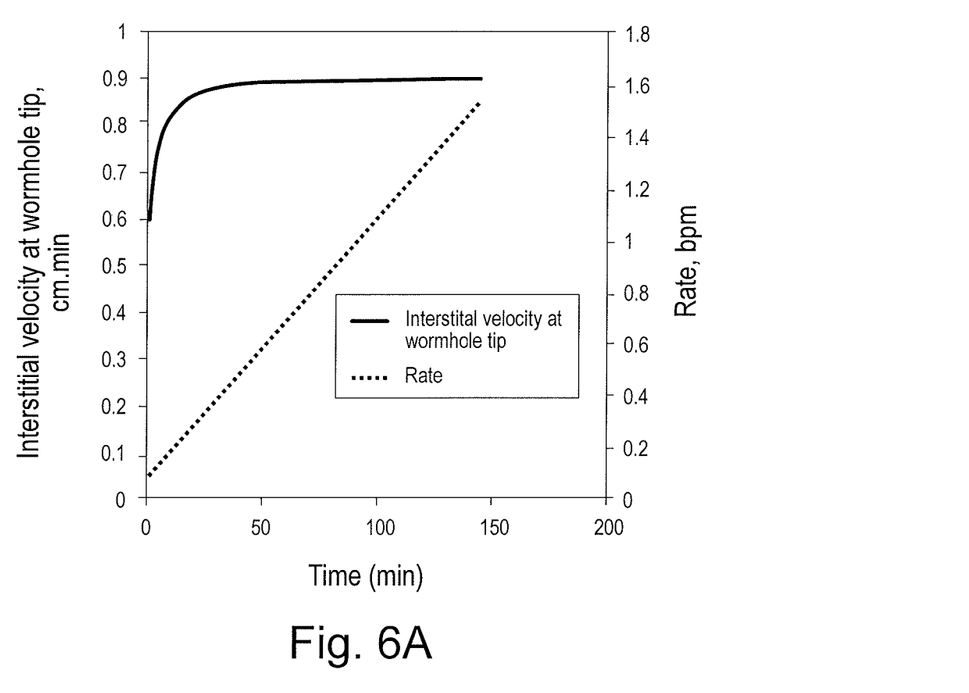
FIGS. 6A and 6B are graphs showing (A) the interstitial velocity of a fluid pumped into a formation over time at an increasing rate, and (B) the corresponding pore volume to breakthrough (PVBT) curve in that formation according to certain embodiments of the present disclosure, respectively.
Figure 6B:
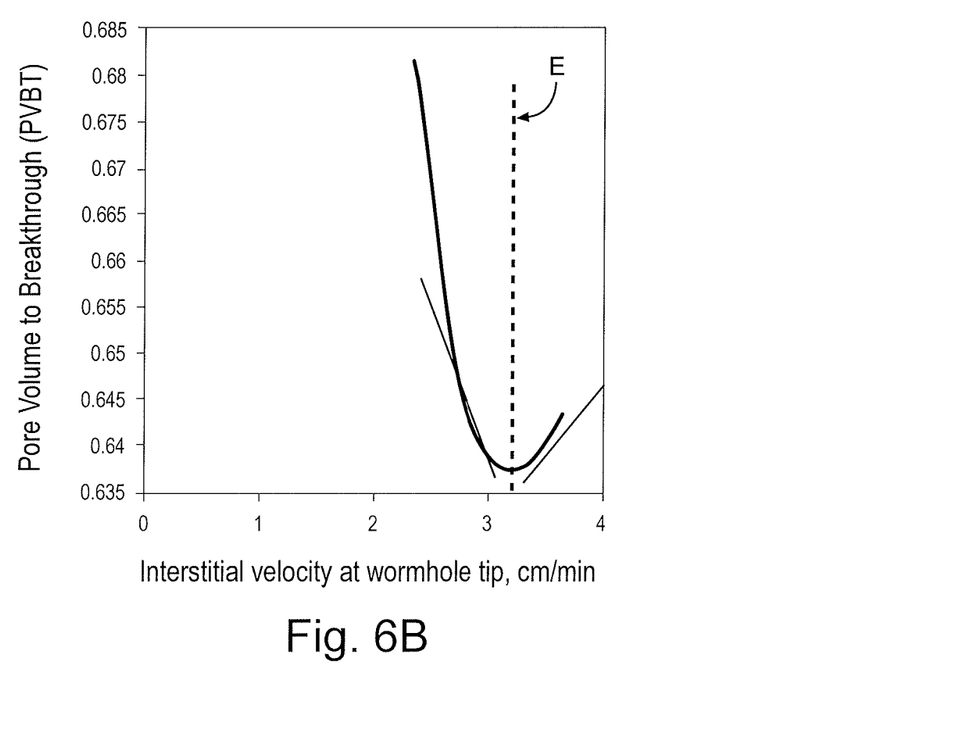

Referring now to FIGS. 6A and 6B, FIGS. 6A and 6B similarly show pumping rate and interstitial velocity over time and a corresponding PVBT curve created for an acidizing treatment in a formation, but instead depict these values for a treatment where the pumping rate of the acidizing fluid is constantly increased over time. This increase in pumping rate produces two simultaneous effects: (1) decreasing interstitial velocity of the fluid as it propagates in the formation away from the wellbore due to the increase in flow area (similar to the embodiment described with respect to FIG. 5A), and (2) increasing interstitial velocity of the fluid due to the increase in pumping rate. The relative magnitude of these two effects determines the profile of interstitial velocity at the wormhole tip as a function of time. In the embodiment depicted in FIG. 6A, the increase in pumping rate is faster and therefore the interstitial velocity of the fluid at the wormhole tip increases with time for at least the first portion of the treatment. In this case, the initial pumping rate was relatively low, and thus the treatment began at an interstitial velocity at a point along the PVBT curve in FIG. 6B with a negative slope, indicating a compact dissolution regime. In certain embodiments of the present disclosure, when the injection rate of the acidizing fluid yields an interstitial velocity at the tip that corresponds to a point along the PVBT curve in the region to the left of line E, this may indicate that the operator should increase the injection rate to increase the interstitial velocity at the wormhole tip, driving the treatment to the right side of the PVBT curve, in order to achieve a uniform dissolution or dominant wormholing regime. In moving along the PVBT curve in FIG. 6B in the direction of increasing interstitial fluid velocity at the wormhole tip (i.e., left to right), the negative slope of the PVBT curve decreases in magnitude until the slope is equal to zero at the interstitial velocity value at line E, at which point the acidizing treatment is in a dominant wormholing regime. Once the interstitial velocity increases further above the level at line E (i.e., to the right of line E), the slope of the PVBT curve changes to a positive value, and the acidizing treatment remains in a dominant wormholing regime up to a certain range followed by transition to a uniform dissolution regime.

Figure 7A:
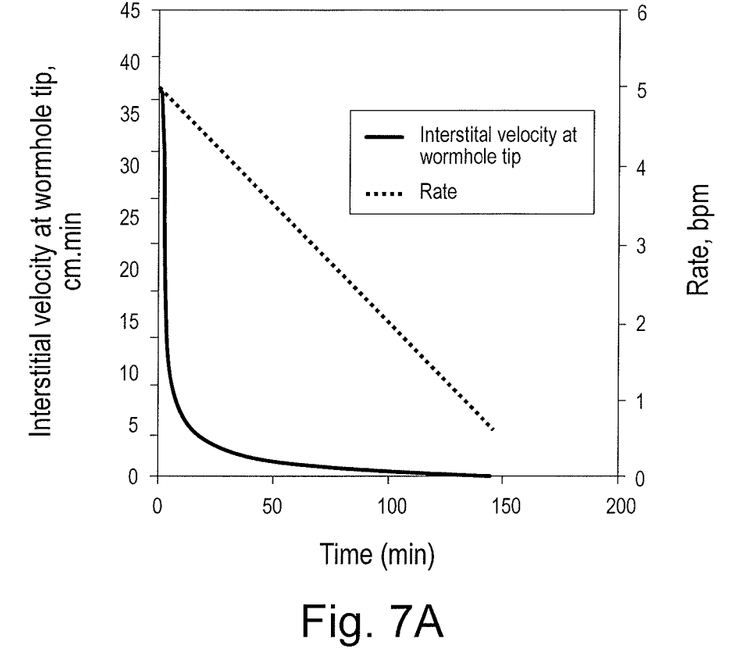
FIGS. 7A and 7B are graphs showing (A) the interstitial velocity of a fluid pumped into a formation over time at a decreasing rate, and (B) the corresponding pore volume to breakthrough (PVBT) curve in that formation according to certain embodiments of the present disclosure, respectively.
Figure 7B:
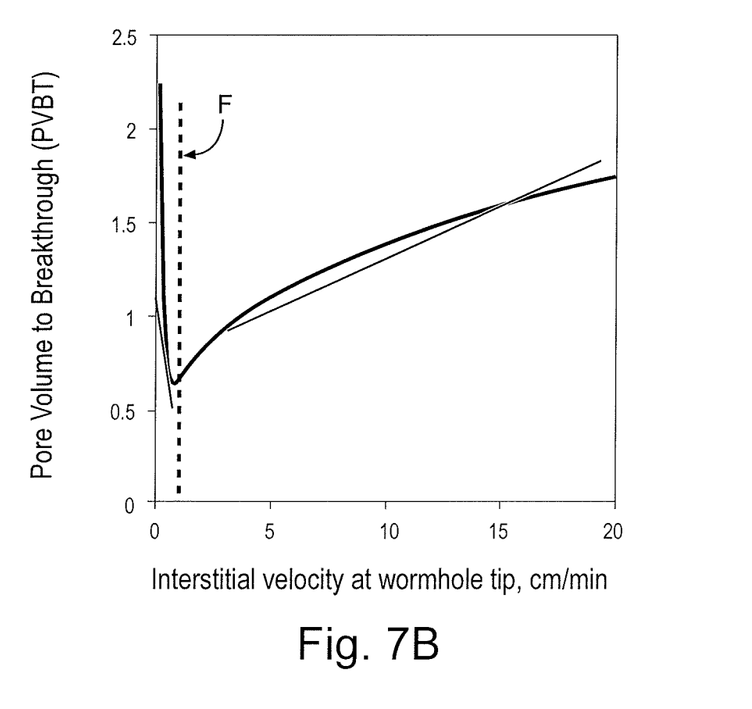

Referring now to FIGS. 7A and 7B, FIGS. 7A and 7B similarly show pumping rate and interstitial velocity over time and a corresponding PVBT curve created for an acidizing treatment in a formation, but instead depict these values for a treatment where the pumping rate of the acidizing fluid is constantly decreased over time. As shown in FIG. 7A, since the acidizing fluid is pumped into the formation at a decreasing rate, the interstitial velocity of the fluid (and fluid flux) at the wormhole tip decreases with time, due to both the decreasing pumping rate and the fluid's propagation in the formation away from the wellbore. Referring to FIG. 7B, in moving along the PVBT curve in the direction of decreasing interstitial fluid velocity at the wormhole tip (i.e., right to left), the slope of the PVBT curve begins as a positive value in the region to the right of line F, and decreases until the slope is equal to zero at the interstitial velocity value at line F. In the region significantly away to the right of line F, the acidizing treatment remains in the uniform dissolution and remains in a dominant wormholing regime close to line F. Once the interstitial velocity decreases further below the level at line F (i.e., to the left of line F), the slope of the PVBT curve changes to a negative value, and the acidizing treatment transitions toward a compact dissolution regime. In certain embodiments of the present disclosure, when the injection rate of the acidizing fluid yields an interstitial velocity at the tip that corresponds to a point along the PVBT curve in the region to the left of line F, this may indicate that the operator should increase the injection rate to increase the interstitial velocity at the wormhole tip, driving the treatment back to the right side of the PVBT curve, in order to maintain a uniform dissolution or dominant wormholing regime.

The examples provided in FIGS. 5A, 5B, 6A, 6B, 7A, and 7B and as described above are not exhaustive of the scope of the present disclosure or its application. The criteria discussed above may be applied to determine wormholing regimes regardless of whether the injection rate is increased, decreased, or kept constant at any moment or combination thereof.

Figure 3:
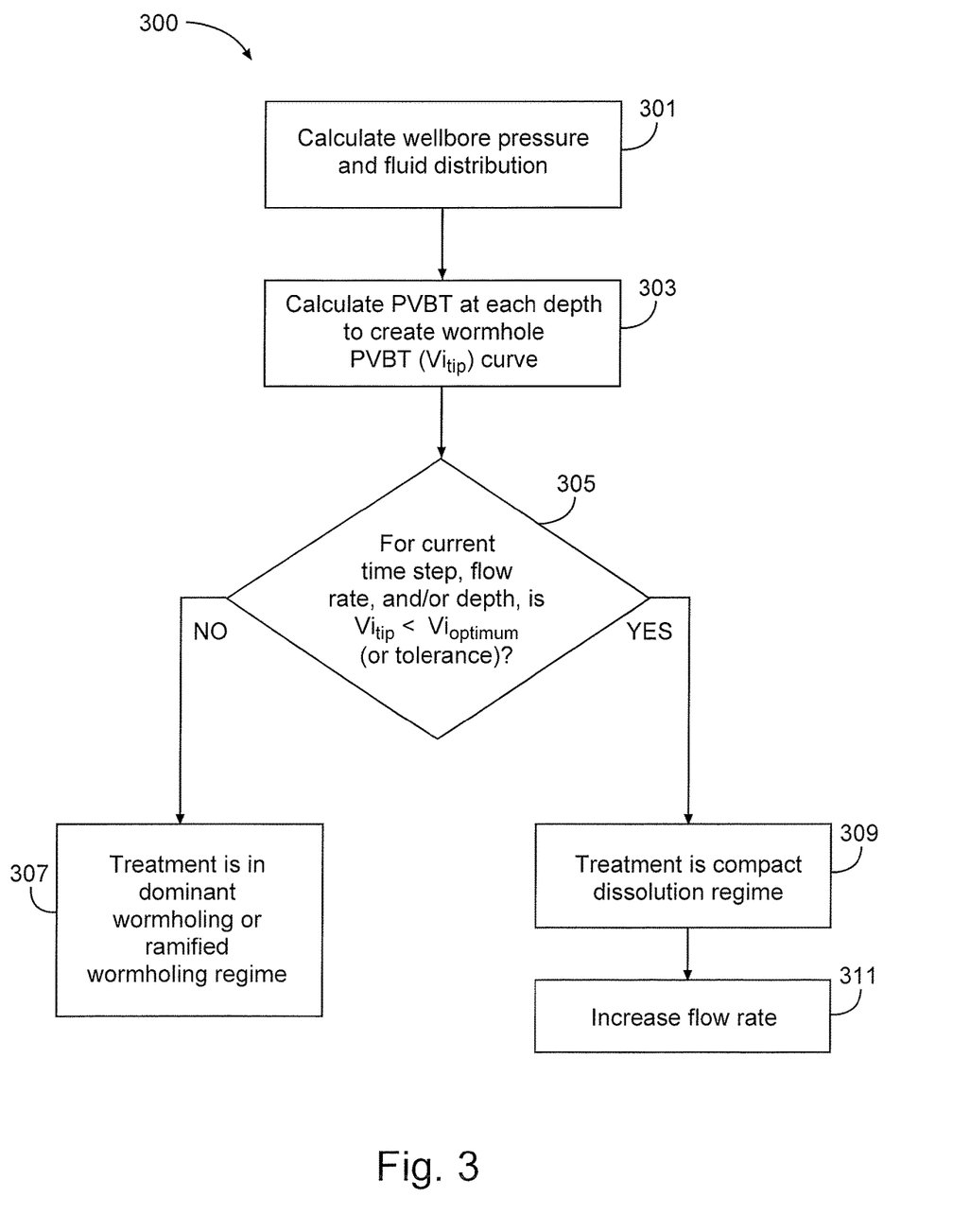
FIG. 3 is a process flow diagram illustrating a method for determining an injection rate for an acidizing treatment fluid according to certain embodiments of the present disclosure.

Another embodiment of a process flow 300 for identifying wormholing regimes during an acidizing treatment according to certain embodiments of the present disclosure is shown in FIG. 3. The use of arrows in FIG. 3 is not meant to imply any particular order in which the methods of the present disclosure must be performed. In block 301, the wellbore pressure and fluid distribution in the treatment interval in the formation is calculated for a current time step t, similar to the manner discussed above for block 101 in FIG. 1. In certain embodiments, a numerical model may be used to calculate fluid distribution and wellbore pressure, which may be similar to the numerical model discussed above. At block 303, a PVBT curve may be created in a manner similar to that discussed above for block 103 in FIG. 1.

In process 300, once the wormhole velocity profile is determined, the optimum interstitial velocity of the fluid for forming a dominant wormhole in the formation $Vi_{optimum}$ may be determined using one or more of various known rate criteria and/or numerical models. In certain embodiments, $Vi_{optimum}$ may represent the interstitial velocity at which the PVBT in the region of the formation is minimized. By way of example and not limitation, the optimum interstitial fluid velocity in an acidizing treatment may be calculated under the Talbot-Gdanski criterion using Equation (12):

$$Vi_{optimum} = \frac{1}{MF}\left(\frac{7}{2W_B}\right)^{2/3} \quad (12)$$

wherein MF is a morphology factor as defined above and $W_B$ is a wormhole B factor as defined above. Of course, other criteria and/or formulas may be used to calculate $Vi_{optimum}$ within the scope and application of the present disclosure depending upon, for example, the equation used to represent the PVBT curve and/or the related wormhole velocity profile. At block 305, the interstitial velocity of the acidizing fluid at the wormhole tip $Vi_{tip}$ may be compared to the optimum interstitial fluid velocity $Vi_{optimum}$.

If $Vi_{tip}$ is not less than (i.e., greater than or equal to) $Vi_{optimum}$, or a minimum endpoint of a tolerance range (e.g., ±25%) of $Vi_{optimum}$, a dominant wormholing regime or ramified wormholing regime may be indicated at block 307. In certain embodiments, neither of these regimes may require an adjustment in the acidizing treatment, and the treatment may be allowed to proceed under the existing parameters. In other embodiments, the process may include further steps to determine whether $Vi_{tip}$ is greater than $Vi_{optimum}$ by some tolerance or threshold amount, which may indicate if the treatment is proceeding according to a ramified wormholing or uniform dissolution regime. In certain embodiments, if such a regime is indicated, the flow or injection rate of the acid or acidizing fluid may be decreased in order to move along the PVBT curve to a point where $Vi_{tip}$ is equal to or within a tolerance range of $Vi_{optimum}$ to produce a dominant wormholing regime.

If $Vi_{tip}$ is less than $Vi_{optimum}$, or a minimum endpoint of a tolerance range (e.g., ±25%) of $Vi_{optimum}$ a compact dissolution regime may be indicated at block 309. In the embodiment shown, this regime may prompt an operator to increase the flow rate of the acid or acidizing fluid at block 311 in order to move along the PVBT curve to a point where $Vi_{tip}$ is equal to or within a tolerance range of $Vi_{optimum}$ to produce a dominant wormholing regime or uniform dissolution regime depending on the objective of the treatment. In certain embodiments, process 300 may be applied to any of the acidizing treatments discussed with respect to FIGS. 5A & 5B, 6A & 6B, or 7A & 7B in a similar fashion. In those embodiments, instead of evaluating the slope of the PVBT curve to indicate the wormholing regime, $Vi_{tip}$ would simply be compared to $Vi_{optimum}$ at the particular flow rate during the treatment to determine the wormholing regime and/or any necessary adjustments to the flow rate. In certain embodiments of process 300, the amount of the appropriate increase or decrease in the injection rate to achieve a dominant wormholing regime may be calculated by substituting $Vi_{optimum}$ calculated using Equation (12) above (or a value within an applicable tolerance range of $Vi_{optimum}$) for $Vi_{tip}$ in Equation (5) above and solving Equation (5) for the injection rate Q.

As a person of skill in the art with the benefit of this disclosure will recognize, the tolerance ranges and percentages discussed above for processes 100 and 300 and other embodiments of the present disclosure, are merely given as examples. These tolerance ranges and percentages may be modified within the spirit and scope of the present disclosure to customize the ranges and criteria for identifying wormholing regimes based on, among other factors, the judgment of the operator, the sensitivity of equipment used, and other factors that will be recognized by a person of ordinary skill in the art with the benefit of this disclosure.

In certain embodiments, acidizing treatments may involve the introduction of an acidizing fluid into a portion of a subterranean formation that comprises one or more zones that vary in rock composition, permeability, porosity, and/or other properties. As a person of skill in the art with the benefit of this disclosure may recognize, the systems and processes of the present disclosure may be applied to the different zones of such a formation by accounting for the different properties therein, for example in the equations used to model the data. Modifying the methods and systems of the present disclosure to account for these heterogeneous formations is within the level of skill in the art with the benefit of this disclosure.

In certain embodiments, one or more of the steps of process 100 and/or 300 may be performed in real-time with an acidizing treatment in a subterranean formation, and may be used to adjust (either manually or automatically) the injection rate of the acidizing fluid in an acidizing treatment according to the present disclosure. For example, one or more computerized simulator programs may be used to simulate acidizing treatments based on one or more mathematical models and known parameters of the treatment, and use the processes and/or methods described herein to monitor or characterize the wormholing regime occurring in a particular acidizing treatment, and/or to calculate or select different injection rates (e.g., higher or lower than the current injection rates) to produce the desired wormholing regime. For example, with the benefit of this disclosure, the computer systems used in the STIM2001™ simulator or other computer simulator systems used in Carbonate 20/20$^{SM}$ acidizing service (available from Halliburton Energy Services, Inc.) may be suitably programmed to perform the methods of the present disclosure.

Figure 4:
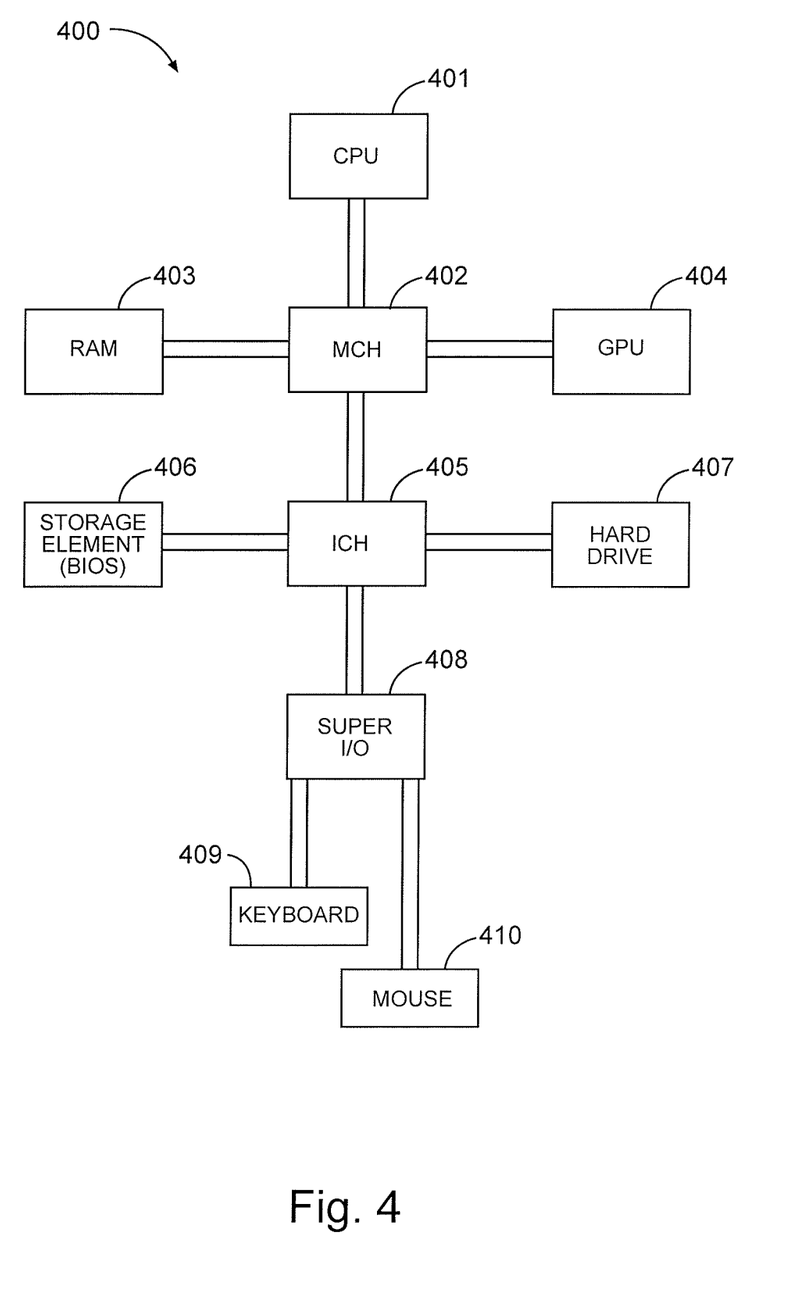
FIG. 4 is a diagram illustrating an information handling system according to certain embodiments of the present disclosure.

FIG. 4 is a block diagram showing an example information handling system 400, according to aspects of the present disclosure. Information handling system 400 may be used, for example, to carry out one or more steps of the process flows of FIGS. 1 and 3, calculate or fit one or more of Equations (1) through (12), monitor or analyze core flood experiments, or monitor or control the injection rate of the acidizing fluid or other parameters of a subterranean acidizing treatment. The information handling system 400 may comprise a data processor or central processing unit (CPU) 401 that is communicatively coupled to a memory controller hub (MCH) or north bridge 402. Memory controller hub 402 may include a memory controller for directing information to or from various system memory components within the information handling system, such as random access memory (RAM) 403, storage element 406, and hard drive 407. The memory controller hub 402 may be coupled to RAM 403 and a graphics processing unit (GPU) 404. Memory controller hub 402 may also be coupled to an input/output (I/O) controller hub (ICH) or south bridge 405. I/O controller hub 405 is coupled to storage elements of the computer system, including a storage element 406, which may comprise a flash read only memory (ROM) that includes a basic input/output system (BIOS) of the computer system. I/O hub 405 is also coupled to the hard drive 407 of the computer system. I/O hub 405 may also be coupled to a Super I/O chip 408, which is itself coupled to several of the I/O ports of the computer system, which may include, for example, keyboard 409 and/or mouse 710. The information handling system 400 further may be communicably coupled to one or more elements of a wellbore treatment system though the chip 408. In certain embodiments, one or more sets of executable instructions according to the present disclosure may be stored within random access memory (RAM) 403, storage element 406, hard drive 407, and/or another computer-readable memory medium coupled to the information handling system. Such instructions, when executed, may cause the processor 401 to perform and/or direct one or more steps of the methods of the present disclosure described herein.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. It may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

Figure 8:
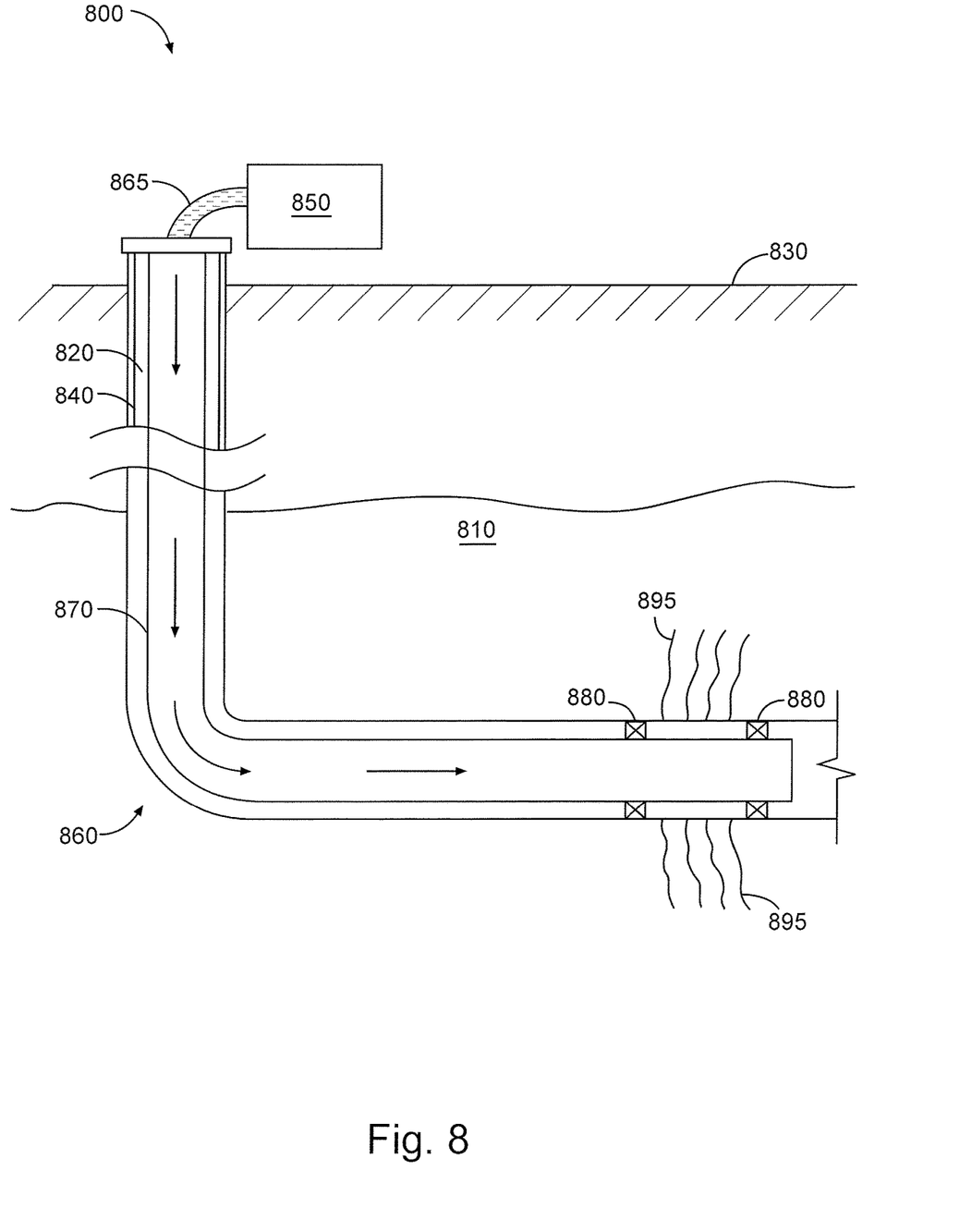
FIG. 8 is a diagram illustrating a well treatment system at a well site according to certain embodiments of the present disclosure.

Certain embodiments of the methods and compositions disclosed herein may directly or indirectly affect one or more components or pieces of equipment associated with the preparation, delivery, recapture, recycling, reuse, and/or disposal of the disclosed compositions. For example, with reference to FIG. 8, the disclosed methods and compositions may directly or indirectly affect one or more components or pieces of equipment associated with an example of a well and treatment system, according to one or more embodiments. Referring now to FIG. 8, a well 860 is shown during an operation according to certain embodiments of the present disclosure in a portion of a subterranean formation of interest 810 surrounding a wellbore 820. The wellbore 820 extends from the surface 830 and through a portion of the subterranean formation 810 surrounding the horizontal portion of the wellbore. Although shown as vertical deviating to horizontal, the wellbore 820 may include horizontal, vertical, slant, curved, and other types of wellbore geometries and orientations, and the treatment may be applied to a subterranean zone surrounding any portion of the wellbore. The wellbore 820 can include a casing 840 that is cemented or otherwise secured to the wellbore wall. The wellbore 820 can be uncased or include uncased sections. Perforations can be formed in the casing 840 to allow fluids and/or other materials to flow into the subterranean formation 810. In cased wells, perforations can be formed using shape charges, a perforating gun, hydro-jetting and/or other tools.

The well treatment system 800 is shown with a work string 870 depending from the surface 830 into the wellbore 820. A pump subsystem 850 is coupled to the work string 870 to pump the acidizing fluid 865 from a fluid source (not shown) into the wellbore 820. The working string 870 may include coiled tubing, jointed pipe, and/or other structures that allow fluid to flow into the wellbore 820. The working string 870 can include flow control devices, bypass valves, ports, and or other tools or well devices that control a flow of fluid from the interior of the working string 870 into the subterranean zone 810. For example, the working string 870 may include ports adjacent the wellbore wall to communicate the acidizing fluid 865 directly into the subterranean formation 810, and/or the working string 870 may include ports that are spaced apart from the wellbore wall to communicate the acidizing fluid 865 into an annulus in the wellbore 820 between the working string 870 and the wellbore wall.

The working string 870 and/or the wellbore 820 may include one or more sets of packers 880 that seal the annulus between the working string 870 and wellbore 820 and/or a downhole portion of the wellbore 820 to define an interval of the wellbore 820 into which particulate materials and/or treatment fluids will be pumped.

As shown, the wellbore 820 penetrates a portion 810 of the subterranean formation, which may include a hydrocarbon-bearing reservoir. In some cases, an acidizing fluid 865 may be pumped through the working string 870 and into the portion 810 of the formation. In some embodiments, the acidizing fluid 865 may contact and react with (e.g., dissolve) acid-susceptible components in the formation 810 to create or enlarge voids or wormholes 895 in the portion 810 of the subterranean formation.

In some embodiments, the injection of the acidizing fluid 865 may be monitored at the well site. In some embodiments, wellbore conditions may be monitored during injection. In certain embodiments, monitored wellbore conditions may be used to determine updated injection rates with processes 100 and 300 shown in FIGS. 1 and 3, respectively. Examples of wellbore conditions that may be suitable for use in the methods of the present disclosure include, but are not limited to temperature, pressure, fluid distribution, injection/flow rate, pH, any physical or chemical property of the formation or formation fluids, and any combination thereof. For example, in certain embodiments, the injection rate could be controlled and/or modified with the methods of the present disclosure during injection using conditions such as fluid distribution and wellbore pressure.

In some embodiments, wellbore conditions of the present disclosure could be measured by sensors. In certain embodiments, sensors could be located in the wellbore. For purposes of this disclosure, the term "sensors" is understood to comprise sources (to emit and/or transmit energy and/or signals), receivers (to receive and/or detect energy and/or signals), and transducers (to operate as a source and/or receiver). In certain embodiments, information from the sensors may be fed into a system or tool that can determine an injection rate or rate profile according to the methods of the present disclosure.

The acidizing fluids used with the methods and systems of the present disclosure may comprise any fluid suitable for use in a subterranean treatment operation that comprises an acid. In certain embodiments, the acidizing fluid may be selected based on the type of subterranean formation, desired stimulation, wellbore conditions, and other factors. The acidizing fluids of the methods of the present disclosure may comprise aqueous fluids, non-aqueous fluids, emulsified fluids, and any combinations thereof. Any pairs or combinations of substantially immiscible base fluids may be used in the methods and systems described herein, including, but not limited to "water-based" fluids and "oil-based fluids." In certain embodiments, acidizing fluids may comprise acids, chelating agents, and any combination thereof. Examples of acids that may be suitable for use in the methods of the present disclosure include, but are not limited to hydrochloric acid ("HCl"), hydrofluoric acid, acetic acid, formic acid, sulfamic acid, chloracetic acid, carboxylic acids, organic acids, any other acid capable of dissolving the subterranean formation, and any combination thereof. Examples of chelating agents that may be suitable for use in the methods of the present disclosure include, but are not limited to ethylenediaminetetraacetic acid ("EDTA"), glutamic acid N,N-diacetic acid ("GLDA"), and any combination thereof.

The acidizing fluids used with the methods and systems of the present disclosure optionally may comprise one or more additional additives, among other reasons, to impart certain properties to the fluid. Examples of additives that may be suitable for use in the methods of the present disclosure include, but are not limited to surfactants, fluid loss control additives, gas, nitrogen, carbon dioxide, foamers, corrosion inhibitors, corrosion inhibitor intensifiers, scale inhibitors, scale removing agents, catalysts, clay control agents, biocides, friction reducers, antifoam agents, bridging agents, flocculants, $H_2S$ scavengers, $CO_2$ scavengers, oxygen scavengers, lubricants, viscosifiers, gelling agents, breakers, weighting agents, relative permeability modifiers, wetting agents, coating enhancement agents, filter cake removal agents, antifreeze agents (e.g., ethylene glycol), diverting agents, particulates, and the like.

In certain embodiments, diverting agents may be used to divert or distribute the acidizing fluids of the present disclosure. Diverting agents may be mechanical devices or chemical diverting agents and are used to ensure uniform injection over the area to be treated. In some embodiments, diverting agents known as chemical diverters function by creating a temporary blocking effect that is safely cleaned up following the treatment, enabling enhanced productivity throughout the treated interval.

An embodiment of the present disclosure is a method comprising: determining a wellbore pressure and a fluid flow distribution for an acidizing fluid introduced into an interval of a well bore penetrating a portion of a subterranean formation; determining a breakthrough pore volume for each of a plurality of depths in the portion of the subterranean formation to provide a PVBT curve comprising the breakthrough pore volume expressed as a function of an interstitial velocity of the acidizing fluid at the tip of a wormhole at each of the plurality of depths; determining whether a slope of the PVBT curve at a point corresponding to a first flow rate of the acidizing fluid in the subterranean formation is less than zero or a minimum point of a range of tolerance thereof; and, if the slope of the PVBT curve at the point corresponding to the first flow rate is less than zero or the minimum point of the range of tolerance thereof, identifying a second flow rate for introducing the acidizing fluid into the interval of the well bore that is greater than the first flow rate.

Another embodiment of the present disclosure is a method comprising: determining a wellbore pressure and a fluid flow distribution for an acidizing fluid introduced into in an interval of a well bore penetrating a portion of a subterranean formation; determining a breakthrough pore volume for each of a plurality of depths in the portion of the subterranean formation to provide a PVBT curve comprising the breakthrough pore volume expressed as a function of an interstitial velocity of the acidizing fluid at the tip of a wormhole at each of the plurality of depths; determining whether a slope of the PVBT curve at a point corresponding to a first flow rate of the acidizing fluid in the subterranean formation is indicative of a compact dissolution regime, a dominant wormholing regime, or a uniform dissolution regime; and, if the slope of the PVBT curve at the point corresponding to the first flow rate is indicative of a compact dissolution regime, identifying a second flow rate for introducing the acidizing fluid into the interval of the well bore that is greater than the first flow rate.

Another embodiment of the present disclosure is a method comprising: determining a wellbore pressure and a fluid flow distribution for an acidizing fluid introduced into in an interval of a well bore penetrating a portion of a subterranean formation; determining an optimum interstitial velocity for the acidizing fluid in the subterranean formation and an interstitial velocity of the acidizing fluid at a tip of a wormhole in the subterranean formation at a first flow rate at each of a plurality of depths; and, if the interstitial velocity of the acidizing fluid at the tip of the wormhole is less than the optimum interstitial velocity or a minimum point of a range of tolerance thereof at one or more of the plurality of depths, identifying a second flow rate for introducing the acidizing fluid into the interval of the well bore that is greater than the first flow rate.

Another embodiment of the present disclosure is a non-transitory computer readable medium containing a set of instructions that, when executed by a processor of an information handling system, cause the processor to: determine a wellbore pressure and a fluid flow distribution for an acidizing fluid introduced into an interval of a well bore penetrating a portion of a subterranean formation; determine a breakthrough pore volume for each of a plurality of depths in the portion of the subterranean formation to provide a PVBT curve comprising the breakthrough pore volume expressed as a function of an interstitial velocity of the acidizing fluid at the tip of a wormhole at each of the plurality of depths; determine whether a slope of the PVBT curve at a point corresponding to a first flow rate of the acidizing fluid in the subterranean formation is less than zero or a minimum point of a range of tolerance thereof; and, if the slope of the PVBT curve at the point corresponding to the first flow rate is less than zero or the minimum point of the range of tolerance thereof, identify a second flow rate for introducing the acidizing fluid into the interval of the well bore that is greater than the first flow rate.

Another embodiment of the present disclosure is a non-transitory computer readable medium containing a set of instructions that, when executed by a processor of an information handling system, cause the processor to: determine a wellbore pressure and a fluid flow distribution for an acidizing fluid introduced into in an interval of a well bore penetrating a portion of a subterranean formation; determine a breakthrough pore volume for each of a plurality of depths in the portion of the subterranean formation to provide a PVBT curve comprising the breakthrough pore volume expressed as a function of an interstitial velocity of the acidizing fluid at the tip of a wormhole at each of the plurality of depths; determine whether a slope of the PVBT curve at a point corresponding to a first flow rate of the acidizing fluid in the subterranean formation is indicative of a compact dissolution regime, a dominant wormholing regime, or a uniform dissolution regime; and, if the slope of the PVBT curve at the point corresponding to the first flow rate is indicative of a compact dissolution regime, identify a second flow rate for introducing the acidizing fluid into the interval of the well bore that is greater than the first flow rate.

Another embodiment of the present disclosure is a non-transitory computer readable medium containing a set of instructions that, when executed by a processor of an information handling system, cause the processor to: determine a wellbore pressure and a fluid flow distribution for an acidizing fluid introduced into in an interval of a well bore penetrating a portion of a subterranean formation; determine an optimum interstitial velocity for the acidizing fluid in the subterranean formation and an interstitial velocity of the acidizing fluid at a tip of a wormhole in the subterranean formation at a first flow rate at each of a plurality of depths; and, if the interstitial velocity of the acidizing fluid at the tip of the wormhole is less than the optimum interstitial velocity or a minimum point of a range of tolerance thereof at one or more of the plurality of depths, identify a second flow rate for introducing the acidizing fluid into the interval of the well bore that is greater than the first flow rate.

Another embodiment of the present disclosure is a system for monitoring and/or performing acidizing treatments in a subterranean formation, the system comprising: at least one data processor; and a memory comprising executable instructions that, when executed, cause the at least one data processor to: determine a wellbore pressure and a fluid flow distribution for an acidizing fluid introduced into an interval of a well bore penetrating a portion of a subterranean formation; determine a breakthrough pore volume for each of a plurality of depths in the portion of the subterranean formation to provide a PVBT curve comprising the breakthrough pore volume expressed as a function of an interstitial velocity of the acidizing fluid at the tip of a wormhole at each of the plurality of depths; determine whether a slope of the PVBT curve at a point corresponding to a first flow rate of the acidizing fluid in the subterranean formation is less than zero or a minimum point of a range of tolerance thereof; and if the slope of the PVBT curve at the point corresponding to the first flow rate is less than zero or the minimum point of the range of tolerance thereof, identify a second flow rate for introducing the acidizing fluid into the interval of the well bore that is greater than the first flow rate.

Another embodiment of the present disclosure is a system for monitoring and/or performing acidizing treatments in a subterranean formation, the system comprising: at least one data processor; and a memory comprising executable instructions that, when executed, cause the at least one data processor to: determine a wellbore pressure and a fluid flow distribution for an acidizing fluid introduced into in an interval of a well bore penetrating a portion of a subterranean formation; determine a breakthrough pore volume for each of a plurality of depths in the portion of the subterranean formation to provide a PVBT curve comprising the breakthrough pore volume expressed as a function of an interstitial velocity of the acidizing fluid at the tip of a wormhole at each of the plurality of depths; determine whether a slope of the PVBT curve at a point corresponding to a first flow rate of the acidizing fluid in the subterranean formation is indicative of a compact dissolution regime, a dominant wormholing regime, or a uniform dissolution regime; and, if the slope of the PVBT curve at the point corresponding to the first flow rate is indicative of a compact dissolution regime, identify a second flow rate for introducing the acidizing fluid into the interval of the well bore that is greater than the first flow rate.

Another embodiment of the present disclosure is a system for monitoring and/or performing acidizing treatments in a subterranean formation, the system comprising: at least one data processor; and a memory comprising executable instructions that, when executed, cause the at least one data processor to: determine a wellbore pressure and a fluid flow distribution for an acidizing fluid introduced into in an interval of a well bore penetrating a portion of a subterranean formation; determine an optimum interstitial velocity for the acidizing fluid in the subterranean formation and an interstitial velocity of the acidizing fluid at a tip of a wormhole in the subterranean formation at a first flow rate at each of a plurality of depths; and, if the interstitial velocity of the acidizing fluid at the tip of the wormhole is less than the optimum interstitial velocity or a minimum point of a range of tolerance thereof at one or more of the plurality of depths, identify a second flow rate for introducing the acidizing fluid into the interval of the well bore that is greater than the first flow rate.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. While numerous changes may be made by those skilled in the art, such changes are encompassed within the spirit of the subject matter defined by the appended claims. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. In particular, every range of values (e.g., "from about a to about b," or, equivalently, "from approximately a to b," or, equivalently, "from approximately a-b") disclosed herein is to be understood as referring to the power set (the set of all subsets) of the respective range of values. The terms in the claims have their plain, ordinary meaning unless otherwise explicitly and clearly defined by the patentee.

What is claimed is:

1. A method comprising:
introducing an acidizing fluid into an interval of a well bore penetrating a portion of a subterranean formation at an initial injection rate;
determining a wellbore pressure and a fluid flow distribution for the acidizing fluid;
determining a breakthrough pore volume for each of a plurality of depths in the portion of the subterranean formation to provide a PVBT curve comprising the breakthrough pore volume expressed as a function of an interstitial velocity of the acidizing fluid at the tip of a wormhole at each of the plurality of depths;
monitoring well bore conditions during introduction of the acidizing fluid into the well bore via a plurality of sensors;
determining whether a slope of the PVBT curve at a point corresponding to a first flow rate of the acidizing fluid in the subterranean formation is less than zero or a minimum point of a range of tolerance thereof; and
if the slope of the PVBT curve at the point corresponding to the first flow rate is less than zero or the minimum point of the range of tolerance thereof, identifying a second flow rate for the acidizing fluid that is greater than the first flow rate and adjusting the acidizing fluid to flow into the interval of the well bore at the second flow rate to provide for a dominant wormholing regime, wherein the second flow rate provides an updated fluid flow distribution, well bore pressure, and interstitial velocity of the acidizing fluid in real time, wherein adjusting the acidizing fluid comprises using a diverting agent to divert the acidizing fluid toward the interval of the well bore, wherein the diverting agent is a mechanical device, wherein the initial injection rate is not affected by adjusting the acidizing fluid to flow at the second flow rate.

2. The method of claim 1 wherein one or more of the steps of determining the wellbore pressure and the fluid flow distribution for the acidizing fluid, determining the breakthrough pore volume for each of a plurality of depths in the portion of the subterranean formation to provide the PVBT curve, determining whether the slope of the PVBT curve at the point corresponding to the first flow rate of the acidizing fluid in the subterranean formation is less than zero or a minimum point of a range of tolerance thereof, and identifying the second flow rate for introducing the acidizing fluid into the interval of the well bore are performed by a data processor.

3. The method of claim 1 further comprising allowing the acidizing fluid to react with at least a portion of the subterranean formation to form or enlarge one or more voids or wormholes in the subterranean formation.

4. The method of claim 1 wherein, if the slope of the PVBT curve at the point corresponding to the first flow rate is greater than zero or a maximum point of the range of tolerance thereof, the method further comprises identifying a third flow rate for introducing the acidizing fluid into the interval of the well bore that is less than the first flow rate.

5. The method of claim 4 further comprising adjusting the acidizing fluid to flow into the interval of the well bore at the third flow rate.

6. The method of claim 5 wherein adjusting the acidizing fluid into the interval of the well bore at the third flow rate comprises using a diverting agent to divert the acidizing fluid away from the interval of the well bore.

* * * * *